United States Patent [19]
Golla et al.

[11] Patent Number: 5,659,509
[45] Date of Patent: Aug. 19, 1997

[54] METHOD FOR PROGRAMMING REDUNDANCY REGISTERS IN A ROW REDUNDANCY INTEGRATED CIRCUITRY FOR A SEMICONDUCTOR MEMORY DEVICE, AND ROW REDUNDANCY INTEGRATED CIRCUITRY

[75] Inventors: Carla Maria Golla, Sesto San Giovanni; Marco MacCarrone, Palestro, both of Italy

[73] Assignee: SGS-Thomson Microelectronics S.r.l., Agrate Brianza, Italy

[21] Appl. No.: 391,999

[22] Filed: Feb. 16, 1995

[30] Foreign Application Priority Data

Feb. 17, 1994 [EP] European Pat. Off. .............. 94830062

[51] Int. Cl.$^6$ ................................................. G11C 29/00
[52] U.S. Cl. ................. 365/200; 365/225.7; 365/230.03; 365/185.09; 365/185.11; 371/10.2; 371/10.3
[58] Field of Search ....................... 365/185.09, 185.11, 365/185.13, 200, 225.7, 230.03; 371/10.2, 10.3

[56] References Cited

U.S. PATENT DOCUMENTS

| 4,358,833 | 11/1982 | Folmsbee et al. | 365/200 |
| 4,441,170 | 4/1984 | Folmsbee et al. | 365/200 |
| 5,337,277 | 8/1994 | Jang | 365/200 |

FOREIGN PATENT DOCUMENTS

| 0655743 | 5/1995 | European Pat. Off. | G11C 16/06 |
| 0657814 | 6/1995 | European Pat. Off. | G06F 11/20 |
| 0668562 | 8/1995 | European Pat. Off. | G06F 11/20 |
| 3138363A1 | 8/1982 | Germany | G11C 8/00 |
| 2265031 | 9/1993 | United Kingdom | G06F 11/20 |
| WO84/04196 | 10/1984 | WIPO | G11C 5/02 |

*Primary Examiner*—David C. Nelms
*Assistant Examiner*—Andrew Q. Tran
*Attorney, Agent, or Firm*—David V. Carlson; Seed and Berry LLP

[57] ABSTRACT

A method for programming non-volatile row redundancy memory registers. Each register is associated with a respective pair of redundancy row and each one programmable to store in two subsets of a set of memory cells a pair of addresses of a respective pair of adjacent defective rows. Each memory register is supplied with row address signals and with a respective selection signal belonging to a set of column address signals. The method provides for: applying to the row address lines the address of a first defective row of the pair of adjacent defective rows; activating one of the selection signals for selecting the register which is to be programmed; applying to a further column address line a first logic level to select for programming in the selected memory register, a first subset of memory cells; enabling the programming of the address of the first defective row of the pair of adjacent defective rows into the first subset of memory cells; applying to at least a subset of the row address lines the address of the second defective row of the pair; applying to the further column line a second, opposite logic level to select for programming, in the selected memory register, at least a group of memory cells of the second subset of the two subsets of memory cells; and enabling the programming of the address of the second defective row of the pair of adjacent defective rows into the second subset of memory cells.

15 Claims, 4 Drawing Sheets

METHOD FOR PROGRAMMING REDUNDANCY REGISTERS IN A ROW REDUNDANCY INTEGRATED CIRCUITRY FOR A SEMICONDUCTOR MEMORY DEVICE, AND ROW REDUNDANCY INTEGRATED CIRCUITRY

TECHNICAL FIELD

The present invention relates to a method for programming redundancy registers in row redundancy integrated circuitry for a semiconductor memory device, and to row redundancy integrated circuitry.

BACKGROUND OF THE INVENTION

Semiconductor memory devices are generally organized in a bidimensional array, or memory matrix, wherein the memory elements are located at the intersection of rows, or "word lines," and columns, or "bit lines," of the matrix. To access a given memory element, it is necessary to select the word line and the bit line at the intersection of which the memory element is located. To this purpose, the memory address bus is divided into row and column address signals, which are decoded independently.

In the manufacture of semiconductor memories, defects are frequently encountered that afflict a limited number of memory elements in the memory matrix. The reason for the high probability of defects of this type resides in that in a semiconductor memory device the greatest part of the chip area is occupied by the memory matrix. Moreover, it is in the memory matrix, and not in the peripheral circuitry, that the manufacturing process characteristics are usually pushed to limits.

In order to prevent rejection of an entire chip due to the presence of a limited number of defective memory elements, out of many millions of memory elements, and therefore increase the manufacturing process yield, the typical manufacturing technique provides for a certain number of additional memory elements, commonly called redundancy memory elements. Redundancy memory elements are to be used as a replacement of those elements that, during testing of the memory device, prove defective. The selection circuits, with which the integrated component must necessarily be provided, and which allow the above-mentioned functional replacement of a defective memory element with a redundancy memory element, are indicated as a whole with the name of "redundancy circuitry," while the set of redundancy memory elements and circuitry is defined as "redundancy."

The redundancy circuitry comprises programmable non-volatile memory registers, or redundancy registers, suitable to store those address configurations corresponding to the defective memory elements. Such registers are programmed once during the memory device testing, and must retain the information stored therein even in absence of the power supply.

In practical implementations of redundancy in memory devices, both word lines and bit lines of redundancy memory elements are generally provided in the memory matrix. Each redundancy word line or bit line is associated with a respective row or column redundancy register, wherein the address of a defective word line or bit line is stored. Whenever the defective word line or bit line is addressed, the corresponding redundancy word line or bit line is selected.

As far as word lines are concerned, it has been recognized that the most frequent defect consists in short-circuits between adjacent word lines. This situation is, however, easily detected during testing. When the selection of one of two short-circuited word lines is attempted, the potential of such word line cannot rise to the designed value, being linked by the short-circuit to the potential of the adjacent non-selected word line. Therefore, when a defective word line is found during testing, it is assumed that such word line is short-circuited with the adjacent word line and both the word lines are replaced by two respective redundancy word lines. From then on, the two defective word lines will never be selected. The adjacent word line, in the scanning sequence, follows the defective word line.

Since defective word lines always come in pairs, it is known to design the row redundancy registers in such a way as to store a pair of row addresses in each row redundancy register. Therefore, each row redundancy register is associated with a respective pair of redundancy word lines: into each row redundancy register can therefore be programmed the addresses of two adjacent short-circuited word lines.

Each row redundancy register comprises programmable non-volatile memory cells wherein the addresses of two adjacent defective word lines can be programmed. Each one of such memory cells must comprise at least one programmable non-volatile memory element, such as a fuse or a floating-gate MOSFET, a load circuit for reading the information stored therein, and a program load circuit for the programming of the memory element according to the logic state of a respective address bit in the row address signal set, or row address bus.

In memory devices the association between the word lines in the memory matrix and the respective selection signals generated by the row address decoding and selection circuitry is generally such that adjacent word lines have addresses which only differ in one bit. Since, however, such bit can be any one of the bits constituting the row address signal set, it follows that in order to be always able to replace two adjacent short-circuited word lines whatsoever, each row redundancy register should store two full row addresses. This means that each row redundancy register must comprise a number of memory cells equal to twice the number of row address bits. Since the memory cells occupy each a significant chip area, this would lead to an excessive increase in the overall chip size, so that the overall process yield is decreased instead of increased. This is why a compromise is generally reached between the repairability rate for defective word line pairs and the increase in chip size. In practice, designers give up the possibility to replace two adjacent short-circuited word lines whatsoever, limiting such replacement to adjacent word lines whose addresses only differ in one or more bit belonging to a given subset of the whole row address signal set. If, for example, the row address signal set comprises m address bits, it can be thought of as being the sum of two subsets n and q such that n contains the most significant row address bits, while q contains the least significant row address bits. Limiting the replacement of defective word line pairs to take place for adjacent word lines having addresses differing in one or more bits of the subset q, it is sufficient to store in a given row redundancy register the full row address m for one of the pair of adjacent word lines, and the subset q for the other word line of the pair. This means that each row redundancy register must be made up of m+q memory cells, instead of 2 m. The impact on the repairability rate can be appreciated by considering that the probability of having a short-circuit defect between two adjacent word lines with addresses differing in one or more bits in the subset n is ½ q.

In the European Patent Application No. 93830474.8, incorporated herein by reference provided as background and not admitted as prior art, a program load circuit for the programming of a memory cell in a non-volatile memory register, such as a row redundancy register, is described. The datum to be programmed into the memory element of the memory cell can be directly supplied by one of the address signal lines already present in the memory device for supplying the decoding circuitry, without the need of generating additional signals.

SUMMARY OF THE INVENTION

One object of the present invention is to provide a method for programming redundancy registers in row redundancy integrated circuitry, which makes use as far as possible of signal lines already existent in the memory device for different purposes, without the need of generating dedicated on-chip signals and thus minimizing the memory device chip size.

According to one embodiment of the present invention, another object is to include row redundancy integrated circuitry that provide full redundancy using a reduced chip area. Such object is attained by means of a method for programming redundancy registers in a row redundancy integrated circuitry for a semiconductor memory device with memory elements located at the intersection of rows and columns of a matrix of memory elements. The row redundancy circuitry comprising a plurality of non-volatile memory registers. Each register is associated with a respective pair of redundancy row of redundancy memory elements and each one programmable to store in two subsets of a set of memory cells a pair of addresses of a respective pair of adjacent defective rows. Each non-volatile memory register is supplied with row address signals and with a respective selection signal belonging to a set of column address signals, the method including the steps of:

(a) applying to the row address signals the address of a first defective row of, the pair of adjacent defective rows;

(b) activating one of the selection signals for selecting the non-volatile register which is to be programmed;

(c) applying to a further signal of the set of column address signals a first logic level to select for programming, in the selected non-volatile memory register, a first subset of the two subsets of memory cells;

(d) enabling the programming of the address of the first defective row of the pair of adjacent defective rows into the first subset of memory cells;

(e) applying to at least a subset of the row address signals the address of a second defective row of the pair of adjacent defective rows;

(f) applying to the further signal of the set of column address signals a second, opposite logic level to select for programming, in the selected non-volatile memory register, at least a group of memory cells of the second subset of the two subsets of memory cells;

(g) enabling the programming of the address of the second defective row of the pair of adjacent defective rows into the second subset of memory cells.

According to another embodiment of the present invention, the other object is attained by means of a row redundancy integrated circuitry for a semiconductor memory device. The device comprises first supply means for supplying each non-volatile memory register with row address signals. When one of the non-volatile memory register's is to be programmed, the first supply means carries the address of the defective rows. The device also has second supply means for supplying each non-volatile memory register with one respective column address signal. The signal is activated to select the respective associated non-volatile memory register for programming. The device further comprises circuit means supplied with a further column address signal for activating, according to the logic state of the further column address signal, either one or the other of two control signals supplied to the non-volatile memory registers. The registers are for selecting the subset of memory cells of the selected non-volatile memory register into which the data carried by the row address signals are to be programmed.

By virtue of the present invention, programming of the row redundancy registers can be carded out by using already existing signals, i.e., address signals normally used to address the memory elements when reading the memory device.

DETAILED DESCRIPTION OF THE INVENTION

Figure 7:
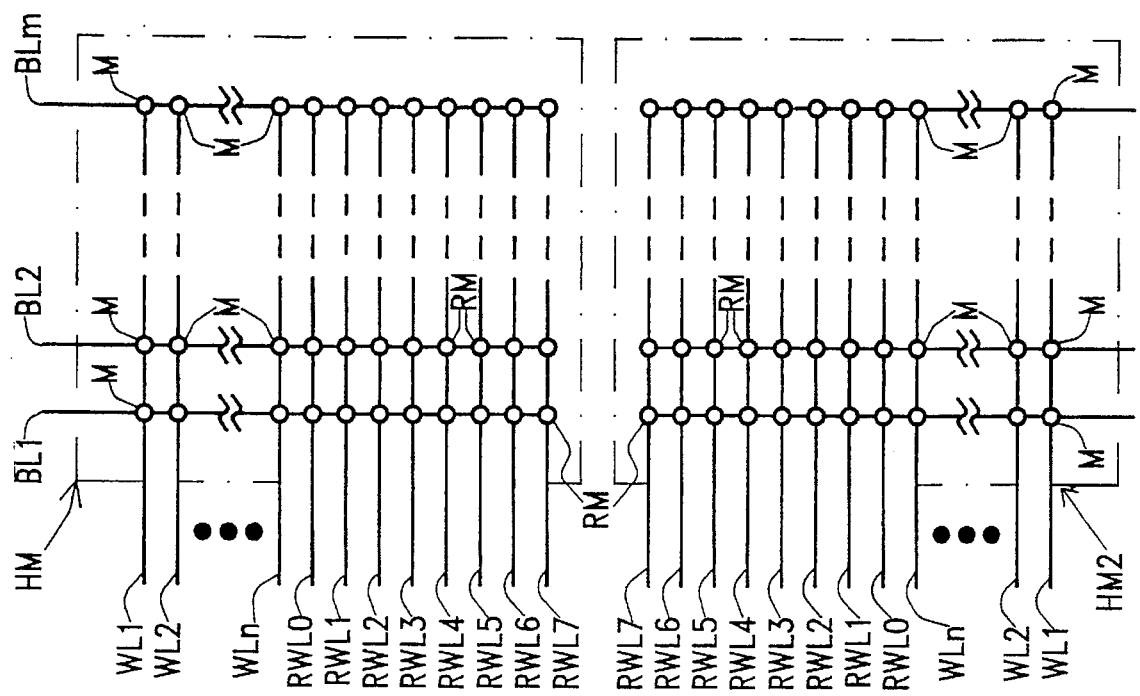
FIG. 7 is a schematic electrical diagram of a memory matrix architecture.
Figure 6:
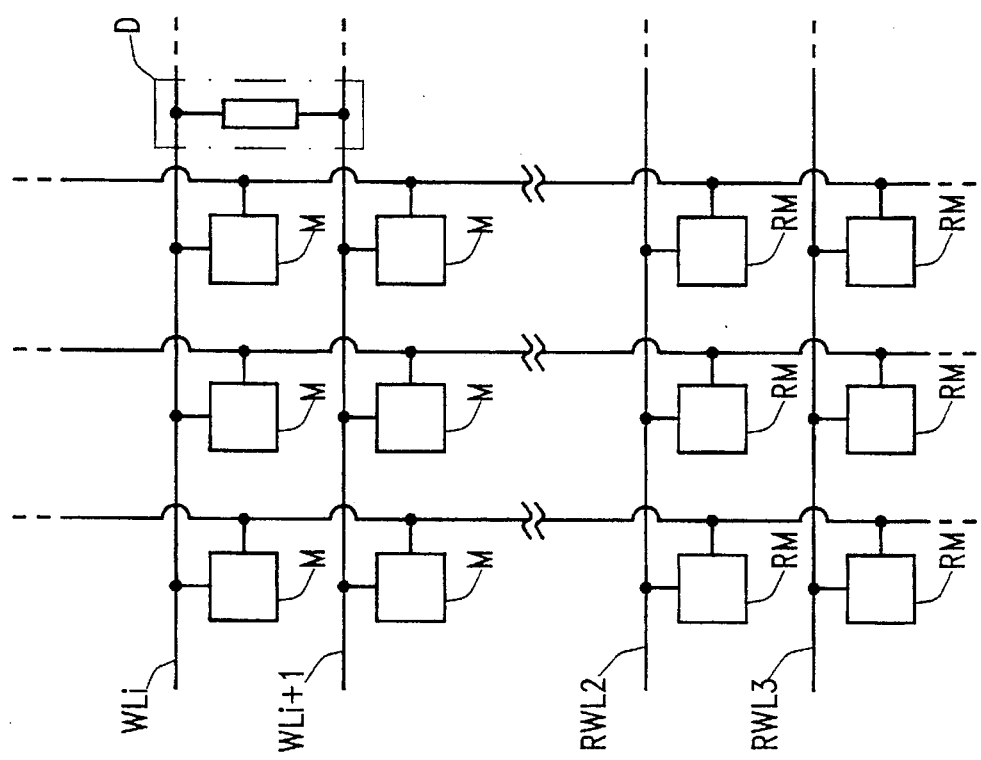
FIG. 6 is a schematic electrical diagram of a part of a matrix of memory elements of a semiconductor memory device showing a pair of defective word lines and a pair of redundancy word lines.

As already described, semiconductor memory devices comprise a matrix of memory elements M as illustrated in FIGS. 6 and 7 located at the intersection of rows WL1–WLn and columns BL1–BLm, and are further provided with redundancy rows RWL0–RWL7 of redundancy memory elements RM. A column redundancy circuit is described in European Patent Application No. 94830061.1. This application is incorporated herein by reference.

Figure 1:
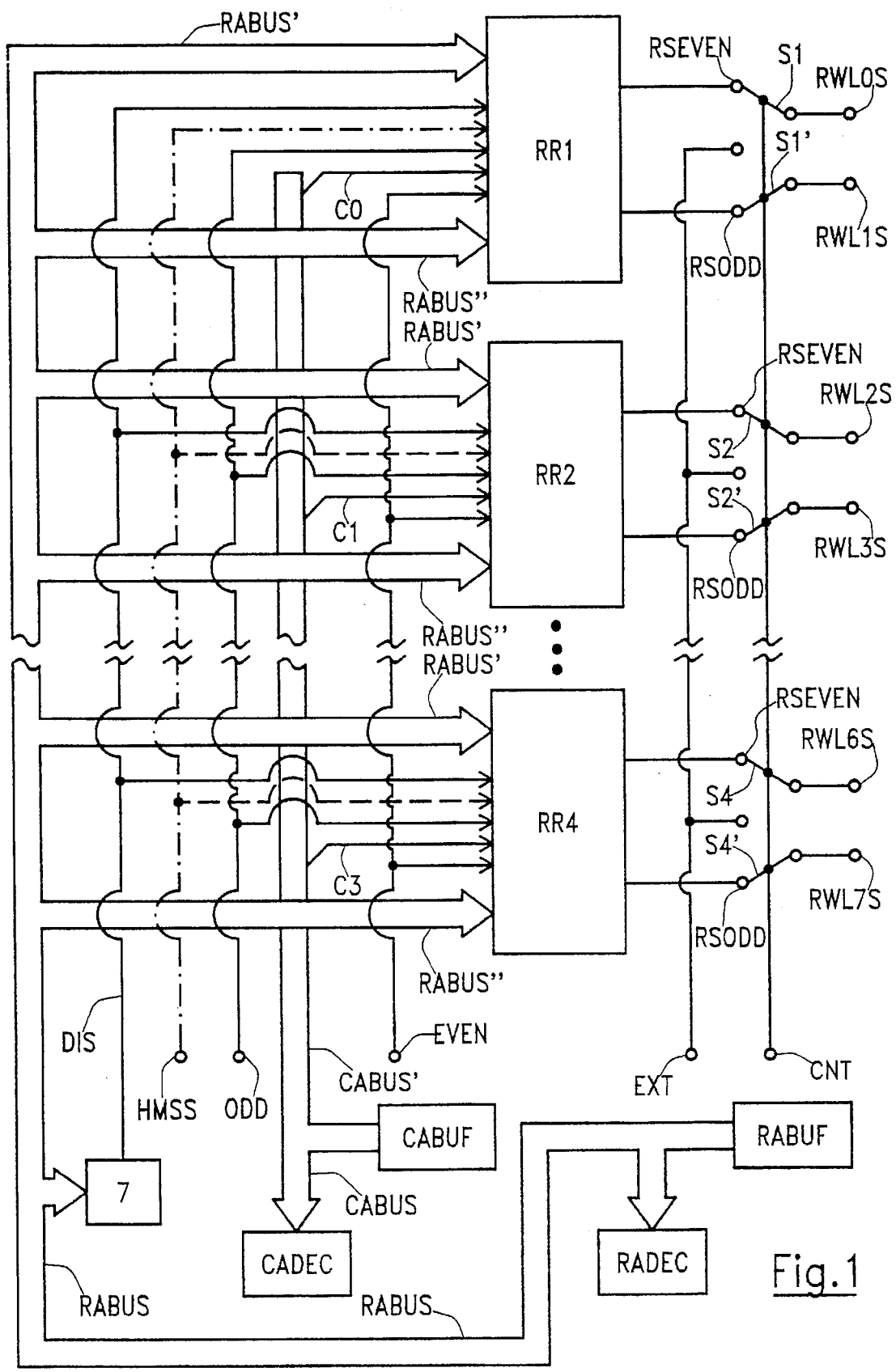
FIG. 1 is a schematic electrical diagram of a row redundancy circuitry according to the present invention.
Figure 2:
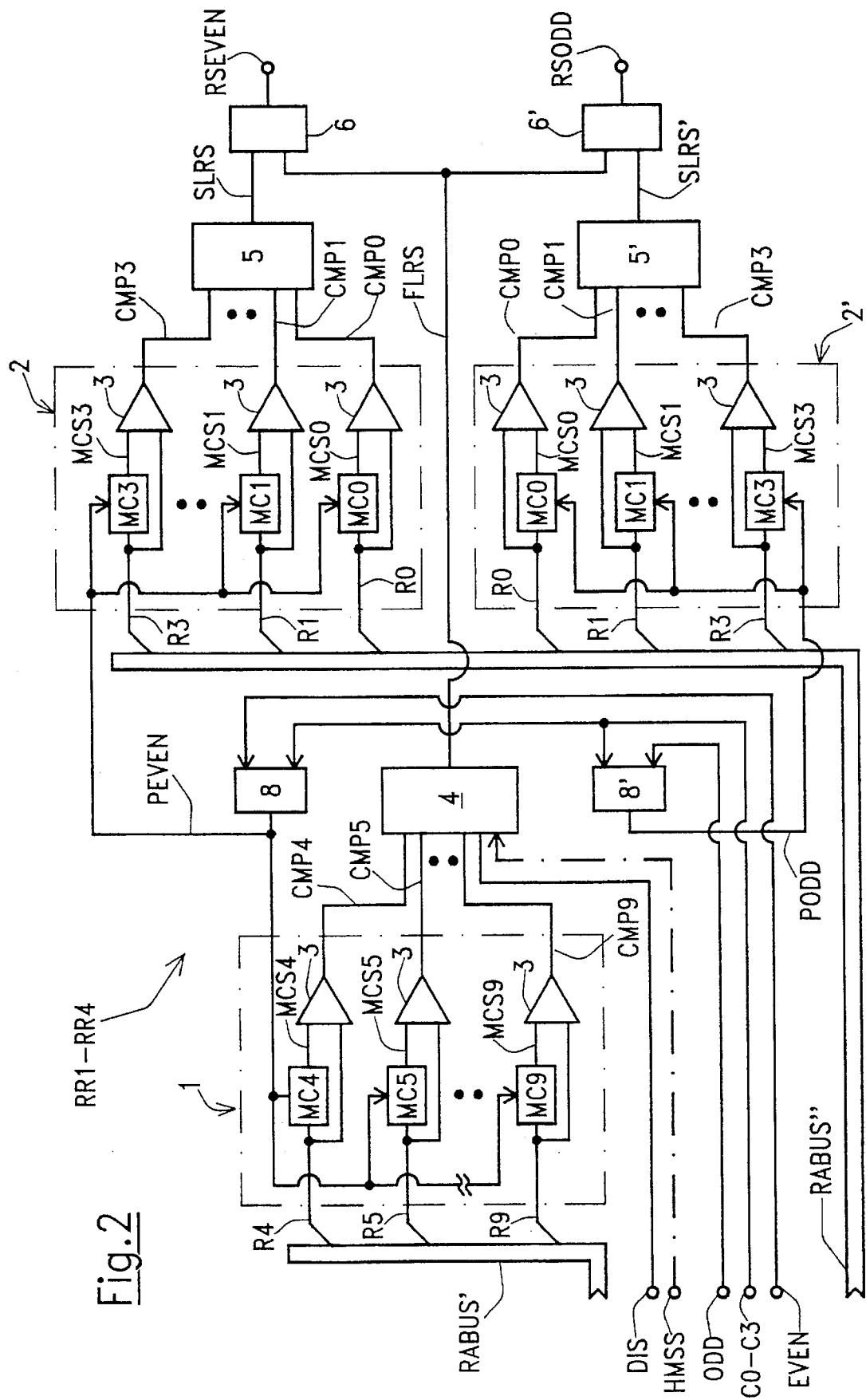
FIG. 2 is a schematic electrical diagram of a redundancy register for the row redundancy circuitry.
Figure 4:
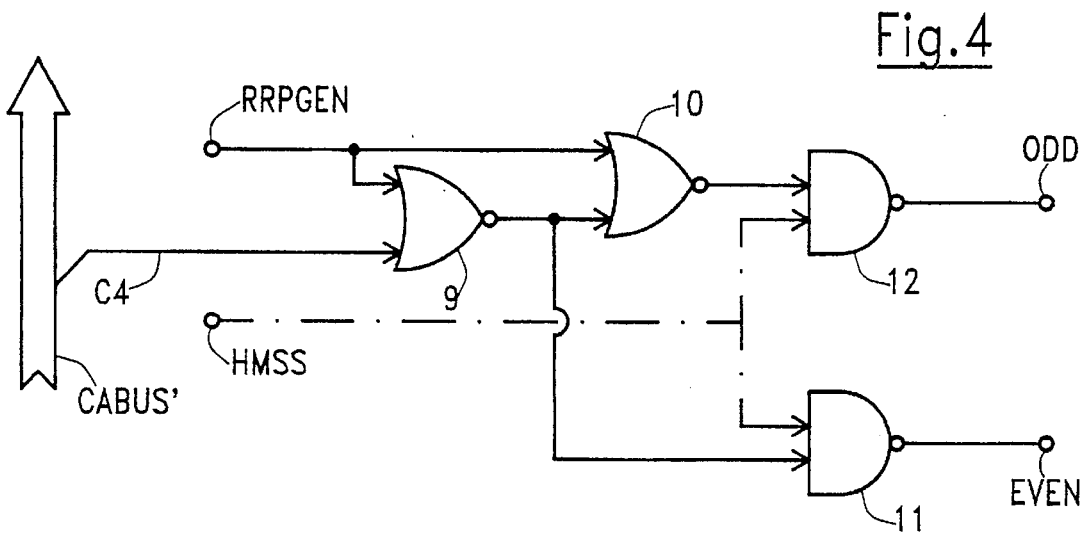
FIG. 4 is a schematic electrical diagram of a circuit for generating control signals for the redundancy circuitry.

As shown in FIG. 1, a row redundancy integrated circuitry according to the invention comprises a plurality of redundancy registers RR1–RR4, each one associated with a respective pair of redundancy word lines RWL0, RWL1–RWL6, RWL7 of FIG. 7. In the discussion immediately following, the memory matrix is explained as if it has a memory matrix architecture of the type comprising only one of the blocks indicated by HM1 or HM2 in FIG. 7; accordingly, the signal HMSS in dash-and-dot line, of FIGS. 1, 2, and 4, is not considered. In the last part of the specification, a memory matrix architecture of the type comprising both the blocks HM1 and HM2 in FIG. 7 is taken into account and described.

As further shown in FIG. 2, each redundancy register RR1–RR4 comprises a first group 1 of programmable non-volatile memory cells MC4–MC9 and two second groups 2 and 2' of programmable non-volatile memory cells MC0–MC3.

The memory cells MC4–MC9 of the first group 1 of each redundancy register RR1–RR4 are each supplied with a respective row address signal R4–R9 taken from a bus RABUS' containing the signals corresponding to the most significant row address bits. The signals of the bus RABUS' are a first subset of a set of row address signals grouped together to form a row address bus RABUS which is generated in a perse known way by a row address input buffer circuitry RABUF and also supplies in a perse known way a row decoding circuitry RADEC for the selection of the word lines WL1–WLn of the memory matrix of FIGS. 1 and 7. Each memory cell MC4–MC9 has an output signal MCS4–MCS9, representing the memory cell status, which is supplied, together with the respective row address signal R4–R9, to a respective comparator 3 whose output signal CMP4–CMP9 is activated only when the memory cell status coincides with the current state of the respective row address signal. Since the comparator 3 deals with digital signals, it can be simply represented by a logic gate. All the signals CMP4–CMP9 supply a first-level redundancy word line selection circuit 4 which, when all the signals CMP4–CMP9 are activated (i.e., when the current state of the most significant row address signals R4–R9 coincides with the logic state stored in the memory cells MC4–MC9 of the first group 1) activates a respective first-level redundancy word line selection signal FLKS. Depending on the logic level which corresponds to the activated state of the signals CMP4–CMP9 and of the signal FLRS, the circuit 4 can be represented by an AND gate when CMP4–CMP9="1" and FLRS="1" is activated, by an OR gate when CMP4–CMP9= "0" and FLRS="0" is activated, by a NAND gate when CMP4–CMP9="1" and FLRS="0" is activated, or by a NOR gate when CMP4–CMP9="0" and FLRS="1" is activated. Further, as it is known to anyone skilled in the art, the circuit 4 can be represented by a tree of few-input logic gates instead of a single six-input logic gate, to increase switching speed.

Each memory cell MC0–MC3 in the two second groups 2 and 2' is supplied with a respective row address signal R0–R3 taken from a bus RABUS". The signals of the bus RABUS" are a second subset of the set of row address signals of the bus RABUS and represent the signals corresponding to the least significant row address bits. Similar to the memory cells MC4–MC9 in the first group 1, each memory cell MC0–MC3 in the groups 2 and 2' has an output signal MCS0–MCS3, representing the memory cell status, which is supplied, together with the respective row address signal R0–R3, to a respective comparator 3 whose output signal CMP0–CMP3 is activated only when the memory cell status coincides with the current state of the respective row address signal. Each one of the two groups of signals CMP0–CMP3 supplies a respective second-level redundancy word line selection circuit 5 and 5' which, when all the signals CMP0–CMP3 of the respective group are activated (i.e., when the current state of the least significant row address signals R0–R3 coincides with the logic state stored in the memory cells MC0–MC3 of the respective second group 2 and 2') activates a respective second-level redundancy word line selection signal SLRS and SLRS'. Practical implementation considerations analogous to those made for the circuit 4 hold for the two circuits 5 and 5'. Each one of the two second-level selection signals SLRS and SLRS' is supplied, together with the first-level selection signal FLRS, to a respective redundancy word line selection circuit 6 and 6' whose output RSODD and RSEVEN is activated when both the first-level selection signal FLRS and the respective second-level selection signal SLRS and SLRS' are activated. The signals RSEVEN and RSODD are connected through a respective switch S1–S4 and S1'–S4' to a respective redundancy word line selection signal RWL0S, RWL2S, RWL4S, RWL6S and RWL1S, RWL3S, RWL5S, RWL7S for the selection of the redundancy word lines. The switches S1–S4 and S1'–S4' are controlled by a control signal CNT, for example activated by an internal control circuitry of the memory device in certain test conditions. The activation of the signal CNT determines the switches to connect the redundancy word line selection signals RWL0s–RWL7S to a single signal line EXT, for example directly connected to a data input/output pad of the memory device, to simultaneously activate all the redundancy word lines. The activation of the signal RSEVEN in one of the redundancy registers RR1–RR4 determines the selection of the even-indexed redundancy word line RWL0, RWL2, RWL4, RWL6 of the associated pair RWL0, RWL1–RWL6, RWL7, while the activation of the signal RSODD determines the selection of the odd-indexed redundancy word line RWL1, RWL3, RWLS, RWL7. Further, the activation of the signal RSEVEN or RSODD prevents the defective word line whose address is stored in the memory cells of the first group 1 and of the second group 2 or 2' of memory cells of the respective redundancy register from being selected.

As described in the European Patent Application No. 93830491.2, corresponding to U.S. patent application Ser. No. 08/349,783, entitled "Redundancy Circuitry for a Semiconductor Matrix," filed on Dec. 6, 1994 by inventors Luigi Pascucci and Carla M. Golla, incorporated herein by reference, it is necessary to prevent ambiguous word line selection to occur. Non-programmed redundancy registers, associated with unused pairs of redundancy word lines, store a particular logic state which belongs to the set of all the possible states for the row address signals R0–R9. When a row address is supplied to the memory device which coincides with the particular logic state, the pairs of redundancy word lines associated with all the non-programmed redundancy registers are simultaneously selected. In summary, the first group of memory cells of one subset coincides with the first group of memory cells of the other subset. This is clearly unacceptable, and the selection of the redundancy word lines must be inhibited whenever a row address is supplied to the memory device which coincides with the particular logic state (which is well known, since it corresponds to the non-programmed or virgin condition of the memory cells MC0–MC9). To this purpose, a combinatorial circuit 7 of FIG. 1 is supplied with the row address bus RABUS to recognize if the current state of the row address signals R0–R9 coincides with the particular logic state. If this occurs, the circuit 7 activates an inhibition signal DIS which is supplied to the first-level redundancy word line selection circuits 4 in all the redundancy registers RR1–RR4 of FIG. 2. This prevents the first-level selection signals FLRS from being activated even if one or more redundancy registers RR1–RR4 exist which has not been programmed, and which therefore stores in the memory cells MC0–MC9 the particular logic state. The combinatorial circuit 7 can be an element of the row address decoding circuitry RADEC.

Figure 5:
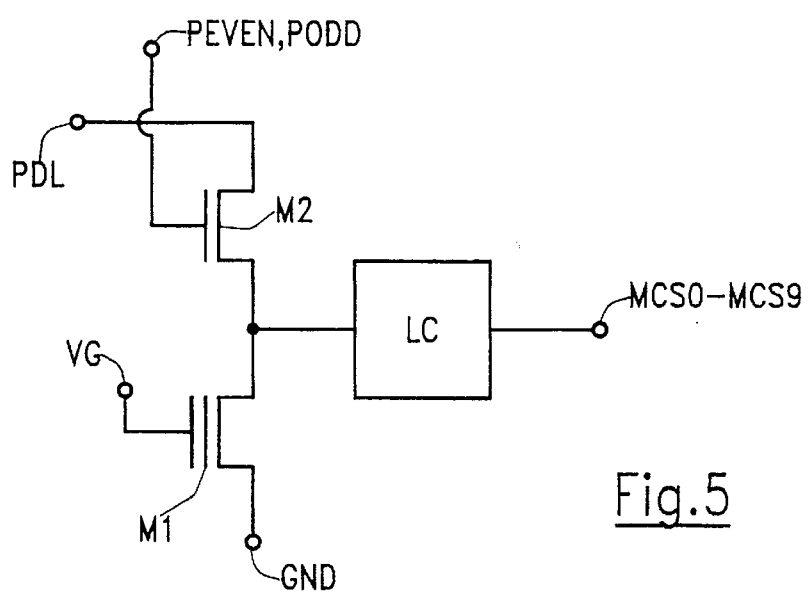
FIG. 5 is a schematic electrical diagram of a programmable non-volatile memory element of the programmable non-volatile memory cell according to the present invention.

As described in the European Patent Application No. 93830474.8, incorporated by reference, and as shown in FIG. 5, each programmable non-volatile memory cell MC0–MC9 comprises a programmable non-volatile memory element. For example, a floating gate MOSFET M1 with source connected to a ground voltage GND and control gate connected to a supply voltage VG which can be switched by control circuitry (not shown) internal to the memory device from a typical reading voltage value of 5 V to a programming high-voltage value of about 12 V. The drain of M1 is connected to a reading load circuit LC whose output is represented by the signal MCS0–MCS9. The drain of M1 is also connected to a programming load circuit substantially represented by a MOSFET M2 whose drain is connected to a programming data line PDL. In each redundancy register RR1–RR4, the programming data lines PDL of the memory cells MC4–MC9 of the first group 1 are each connected to a respective one of the most significant row address signals R4–R9, while the programming data lines PDL of the memory cells MC0–MC3 of the two second groups 2 and 2' are each connected to a respective one of the least significant row address signals R0–R3. In each redundancy register RR1–RR4, the gate of the MOSFET M2 in the memory cells MC4–MC9 of the first group 1 and in the memory cells MC0–MC3 of the group 2 is connected to an output signal PEVEN of a first ground/high-voltage switch 8 of FIG. 2, while the gate of the MOSFET M2 in the memory cells MC0–MC3 of the group 2' is connected to an output signal PODD of a second ground/high-voltage switch 8'. High voltage switches 8 and 8' can be of a type known per se in the art. A first control signal EVEN commonly supplies all the switches 8, while a second control signal ODD commonly supplies all the switches 8'. The switches 8 and 8' in each redundancy register RR1–RR4 are commonly supplied with a respective column address signal C0–C3 taken from a bus CABUS' which contains a subset of a set of column address signals grouped together in a column address bus CABUS. The column address bus CABUS is generated in a per-se known way by a column address input buffer circuitry CABUF and also supplies, in a per-se known way, a column address decoding circuitry CADEC for the selection of bit lines of the memory matrix of FIGS. 1 and 7.

Figure 3:
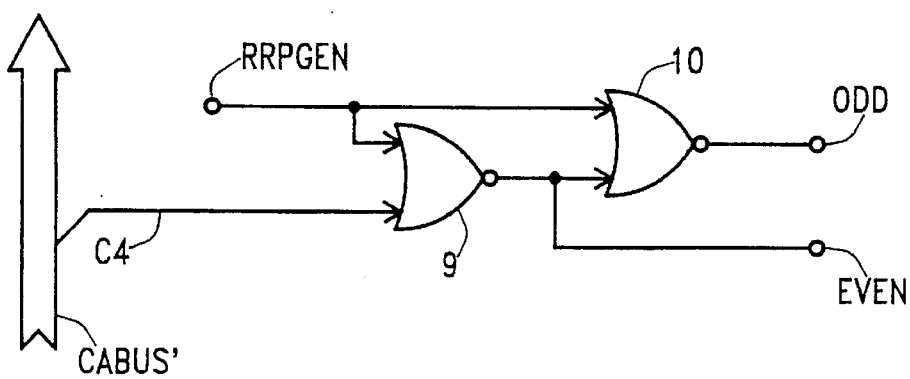
FIG. 3 is a schematic electrical diagram of a circuit for generating two control signals, EVEN and ODD, of the redundancy register of FIG. 2.

An example of a circuit for generating the two control signals EVEN and ODD is shown in FIG. 3. The circuit includes a first NOR gate 9 supplied with a control signal RRPGEN (redundancy register program enable) activated by the control circuitry internal to the memory device, and with a further column address signal C4 taken from the bus CABUS'. An output of the NOR gate 9 represents the control signal EVEN, and is supplied to a second NOR gate 10 which is also supplied with the signal RRPGEN, and whose output represents the control signal ODD. In this example, it is assumed that the activated state for the two control signals EVEN and ODD corresponds to the "1" logic state, while the signal RRPGEN is activated by driving it to the "0" logic state. The column address signal C4 is used to selectively activate either the signal EVEN or the signal ODD when RRPGEN is activated. C4="0" activates the signal EVEN, while C4="1" activates the signal ODD. Other embodiments are obviously possible, depending on the logic level corresponding to the activated state of the signal RRPGEN. The essential requirement is that when the signal RRPGEN is not activated, both of the control signals EVEN and ODD are also not activated, independently from the logic state of the column address signals C4. When RRPGEN is activated, however, either EVEN or ODD is activated depending on the logic state of C4.

During the memory device testing, different word lines WL1–WLn, as illustrated in FIG. 7, of the memory matrix are addressed sequentially, starting for example from the word line WL1. Let us suppose that a word line WLi of FIG. 6 proves defective. As previously described, it is assumed that a defect D exists such that the word line WLi is short-circuited with the adjacent word line WLi+1 which, in the testing scanning sequence, follows WLi. This means that not only WLi, but also WLi+1 is defective, and the word line pair WLi, WLi+1 must be replaced by a pair of redundancy word lines, for example by the pair RWL2, RWL3. To this purpose, the addresses of the word lines WLi and WLi+1 must be programmed into the redundancy register RR2 which is associated to with RWL2 and RWL3. According to the method of the present invention, the memory device is supplied with a row address corresponding to that of the defective word line WLi, so that the row address bus RABUS carries one of the two addresses to be programmed into the redundancy register RR2. The memory device is further supplied with a column address such that the column address signals C0 and C2 to C4 are logic "0"s, while C1 is a logic "1", to selectively program RR2 among all the redundancy registers RR1–RR4. When the internal control circuitry drives the signal RRPGEN to the "0" logic state, since C4="0", the signal EVEN is activated, i.e., driven to "1", while the signal ODD is kept to "0". Since in RR2 the switch 8 has both the inputs EVEN and C1 in the "1" logic state, its output PEVEN is driven to the programming high-voltage value, while the switch 8', having just one input C1 in the "1" logic state and the other input ODD in the "0" logic state, keeps its output PODD at the ground voltage level. The signal PEVEN turns on the MOSFET M2 in the memory cells MC4–MC9 of the group 1 and in the memory cells MC0–MC3 of the group 2 of the redundancy register RR2. Simultaneously to the activation of RRPGEN, the internal control circuitry switches the gate voltage VG of the floating-gate MOSFET M1 of all the memory cells to the programming high-voltage value. In the memory cells wherein the MOSFET M2 is on, the floating-gate transistor M1 will therefore have a programming high-voltage value applied to its gate, and a drain voltage depending on the logic state of the respective programming data line PDL. If PDL is a logic "1", electrons will be injected into the floating gate of M1, causing a threshold voltage shift, while if PDL is a logic "0", no injection of electrons takes place, and no threshold voltage shift affects M1. The load circuit LC is designed to detect such threshold voltage shifts. In all the memory cells wherein M2 is off, the drain of M1 is left floating, and no electron injection takes place; M1 will therefore not change its programming state.

The most significant row address signals R4–R9 of the address of WLi are thus programmed into the memory cells MC4–MC9 of the group 1 of RR2, and the least significant row address signals R0–R3 are programmed into the memory cells MC0–MC3 of the group 2 of RR2. This means that the defective word line WLi is redunded by the redundancy word line RWL2.

After this step, the signal RRPGEN is deactivated, and the row address supplied to the memory device is changed into the address of the defective word line WLi+1. Since WLi+1 is adjacent to WLi, its address will differ from the address of WLi only in the least significant bits. For this reason, in order to replace WLi+1 with RWL3 it is not necessary to have the full address of WLi+1 stored in the redundancy register RR2, being sufficient to store only the least significant bits of such address. To this purpose, the memory device is supplied with a row address such that the row address signals R0–R3 carry the least significant part of the address of WLi+1. Further, the column address supplied to the memory device is changed so that C4 is now a logic "1" while C0, C2 and C3 are still logic "0"s. When the signal RRPGEN is re-activated, the control signal ODD is driven to a logic "1", while the signal EVEN is kept to "0". In this way the switch 8' drives its output PODD to the programming high-voltage, and the logic value of the row address signals R0–R3 is thus programmed into the memory cells MC0–MC3 of the group 2' of RR2.

When the memory device is operated in a reading condition, and the row address supplied to it coincides with the address of WLi, the memory cell status signals MCS4–MCS9 in RE2 coincide with the respective row address signals R4–R9, and the signals CMP4–CMP9 are activated. The same happens for the memory cells MC0–MC3 of the group 2 of RR2. Since the first- and second-level redundancy row selection signals FLRS and SLRS in RR2 are activated, the signal KSEVEN is also activated, so that the redundancy word line RWL2 is selected instead of WLi. Analogously, when the row address supplied to the memory device coincides with the address of WLi+1, in which the logic state of the most significant bits is identical to that of the address of WLi, the signals FLRS and SLRS' are activated, so that the redundancy word line RWL3 is selected instead of WLi+1. The pair of defective word lines WLi, WLi+1 is therefore functionally replaced by the pair of redundancy word lines RWL2, RWL3.

It should be noted that the pair of adjacent short-circuited word lines WLi, WLi+1 can be replaced by the redundancy word line pair RWL2, RWL3 only if the addresses of WLi and WLi+1 differs in one or more bits belonging to their least significant part, represented by the row address signals R0–R3. This is due to the fact that each redundancy register RR1–RR4 comprises a unique group, the first group 1, of memory cells MC4–MC9, to store the most significant bits of the row address of a pair of word lines. Pairs of adjacent defective word lines with addresses differing in one or more bits belonging to their most significant part, represented by the row address signals R4–R9, cannot therefore be replaced by redundancy word line pairs. The impact on the repairability rate can be appreciated by considering that the probability of having a defect between two adjacent word lines with addresses differing in one or more bits in their most significant part is 1/16. Such a compromise allows to limit the number of memory cells required in each redundancy register to 6+4+4. It is obviously possible to increase the repairability rate, by decreasing the number of memory cells in the common first group 1, and increasing the number of memory cells in the two second groups 2 and 2', at the expense of an increase in the overall number of memory cells, and thus in the chip size. If, for example, the first group 1 of memory cells is made to comprise five memory cells, and each of the two second groups 2 and 2' five memory cells, the probability of having a non-repairable defect lower to 1/32. But, the number of memory cells required for each redundancy register increases of one unity (5+5+5), which, given the four redundancy registers RR1–RR4 existent, means an overall increase of four memory cells.

FIG. 7 shows a particular memory matrix architecture which is sometimes used in memory devices: such architecture provides for splitting the memory matrix into two half-matrices HM1 and HM2. Each half-matrix is made up of an equal number of memory elements M located at the intersection of word lines WL1–WLn and bit lines BL1–BLm. Each logic configuration of row address signals determines the selection of a respective word line in each half-matrix; an extra address bit is required to select between the two half-matrices.

Each half-matrix is further provided with a plurality of redundancy word line pairs RWL0, RWL1–RWL6, RWL7. Defective word line pairs in one half-matrix are replaced by redundancy word line pairs of the same half-matrix.

A row redundancy circuitry for a memory device with such a memory matrix architecture is composed by two identical circuit parts, substantially identical to the row redundancy circuitry previously described. One of the two circuit parts is again shown in FIGS. 1 and 2, taking into account the signal HMSS in dash-and-dot line. Such a signal represents a half-matrix selection signal, and can be regarded as an extra address signal used to select one or the other of the two half-matrices; the second part of the redundancy circuitry is not shown but is exactly identical to the first part, except from the fact that the signal HMSS is replaced by its logic complement.

The above-mentioned row redundancy circuitry allows to increase the repairability rate, since the replacement of a defective word line pair in a given half-matrix matrix does not cause such replacement to occur also for the word line pair in the other half-matrix but having the same address.

To this purpose, the signal HMSS supplies all the redundancy registers RR1–RR4; inside each redundancy register RR1–RR4, HMSS supplies the first-level redundancy word line selection circuit 4. When the signal HMSS is not activated, i.e., when the other half-matrix is addressed, the activation of the first-level selection signals FLRS is inhibited. This prevents that, if in the two half-matrixes two pairs of defective word lines with the same addresses exist, addressing the memory device with such defective row address causes the simultaneous selection of two redundancy word lines.

Further, the generation of the two control signals EVEN and ODD in each part of the redundancy circuitry is submitted to the activation of the respective half-matrix selection signal. An example of circuit for the generation of the control signals EVEN and ODD for this embodiment is shown in FIG. 4. Differently from the circuit of FIG. 3 for the previous embodiment, the output signal of the NOR gate 9 is supplied, together with the signal HMSS, to a first NAND gate 11 whose output constitutes the control signal EVEN. Similarly, the output of the NOR gate 10 is supplied, together with the signal HMSS, to a second NAND gate 12, whose output constitutes the signal ODD. A similar circuit will be provided in the other part of the redundancy circuitry, the signal HMSS being replaced by its logic complement. In this way, the activation of either one of the two control signals EVEN or ODD is submitted to the activation of the half-matrix selection signal HMSS. This is necessary during programming of the redundancy registers to select one out of two redundancy registers belonging to different parts of the row redundancy circuitry but supplied with the same column address signal C0–C3.

The above-described detailed description illustrates preferred embodiments of the present invention. This detailed description will enable those skilled in the art to make various modifications to the described preferred embodiments that do not depart from the spirit and scope of the present invention. Accordingly, the present invention contemplates all such modifications that read on the appended claims and equivalents thereof.

We claim:

1. A method for programming redundancy registers in a row redundancy integrated circuitry for a semiconductor memory device with memory elements located at the intersection of rows and columns of a matrix of memory elements, the row redundancy circuitry including a plurality of non-volatile memory registers, each said plurality of non-volatile memory registers associated with a respective pair of redundancy row of redundancy memory elements and each said plurality of non-volatile memory registers programmable to store in two subsets of a set of non-volatile memory cells a pair of addresses of a respective pair of adjacent defective rows, each non-volatile memory register having row address lines and a selection line, the method comprising the steps of:

a) applying to said row address lines the address of a first defective row of said pair of adjacent defective rows;

b) applying a column address signal to the selection line for selecting the non-volatile memory register which is to be programmed;

c) applying a first logic level to select for programming, in the selected non-volatile memory register, a first subset of the two subsets of non-volatile memory cells;

d) programming the address of the first defective row of the pair of adjacent defective rows into said first subset of non-volatile memory cells;

e) applying to at least a subset of said row address lines the address of a second defective row of said pair of adjacent defective rows;

f) applying a second, opposite logic level to select for programming, in the selected non-volatile memory register, at least a group of non-volatile memory cells of the second subset of the two subsets of non-volatile memory cells; and g) programming the address of the second defective row of the pair of adjacent defective rows into the second subset of non-volatile memory cells.

2. Row redundancy integrated circuitry for a semiconductor memory device with memory elements located at the intersection of rows and columns of a memory matrix of memory elements, the row redundancy circuitry including a plurality of non-volatile memory registers, each said plurality of non-volatile memory registers associated with a respective pair of redundancy rows of redundancy memory elements and each said plurality of non-volatile memory registers programmable to store in two subsets of a set of non-volatile memory cells a pair of addresses of a respective pair of defective rows, the circuitry comprising:

first supply means for supplying each non-volatile memory register with row address signals which, when one of the non-volatile memory registers is to be programmed, carrying the address of the defective rows;

second supply means for supplying each non-volatile memory register with a column address signal to select the respective non-volatile memory register for programming; and circuit means supplied with either one of two control signals applied to the non-volatile memory registers for selecting a subset of non-volatile memory cells of the selected non-volatile memory register into which the address carried by the row address as signals are to be programmed.

3. The row redundancy integrated circuitry according to claim 2 wherein each subset of non-volatile memory cells further includes a first group of non-volatile memory cells, supplied with a first portion of the row address signals containing the most significant row address signals, and a second group of non-volatile memory cells, supplied with a second and opposite portion of the row address signals containing the least significant row address signals.

4. The row redundancy integrated circuitry according to claim 3 wherein the first group of non-volatile memory cells of one subset coincides with the first group of non-volatile memory cells of another subset.

5. The row redundancy integrated circuitry according to claim 2 wherein each non-volatile memory cell comprises at least one programmable non-volatile memory element, a load circuit for reading the information stored in said non-volatile memory element, and a programming load circuit for electrically connecting said non-volatile memory element to a respective row address signal.

6. The row redundancy integrated circuitry according to claim 5 wherein said programming load circuit comprises a transistor which is connected between said respective row address signal and a supply electrode of the non-volatile memory element, and is controlled by a program enable signal.

7. The row redundancy integrated circuitry according to claim 3 wherein each non-volatile memory register further includes first program selection means supplied with said column address signal and one of said two control signals and supplying the non-volatile memory cells of the first group of non-volatile memory cells of the two subsets of non-volatile memory cells and the non-volatile memory cells of the second group of non-volatile memory cells with a first program enable signal, and second program selection means supplied with said column address signal and the other of said two control signals and supplying the second group of non-volatile memory cells with a second program enable signal.

8. Row redundancy circuitry for use a semiconductor memory device, the row redundancy circuitry comprising:

a first row address bus having a first plurality of row address lines;

a first group of programmable non-volatile memory cells, each non-volatile memory cell having a first input coupled to a corresponding row address line from among the first plurality of row address lines;

a second row address bus having a second plurality of row address lines;

a second group of programmable non-volatile memory cells, each non-volatile memory cell having a first input coupled to a corresponding row address line from among the second plurality of row address lines;

a third group of programmable non-volatile memory cells, each non-volatile memory cell having a first input coupled to a corresponding row address line from among the second plurality of row address lines; and a programming control circuitry having a first output and a second output, the first output being coupled to each non-volatile memory cell of the first and second group of programmable non-volatile memory cells, and the second output being coupled to each non-volatile memory cell of the third group of programmable non-volatile memory cells.

9. The row redundancy circuitry of claim 8 wherein the programming control circuitry further includes:

a programming control line;

a column determining line;

a logic circuit having a first input, a second input, a first output and a second output, the first input being coupled to the progamming control line, the second input being coupled to the column determining line;

a column address bus having a plurality of column address lines and coupled to said column determining line;

a first switch having a first input, a second input and an output, the first input being coupled to a first respective column address line from among the plurality of column address lines, the second input being coupled to the first output of the logic circuit, and wherein the output of the first switch includes the first output of the programming control circuitry; and a second switch having a first input, a second input and an output, the first input being coupled to a second respective column address line from among the plurality of column address lines, the second input being coupled to the second output of the logic circuit, and wherein the output of the second switch includes the second output of the programming control circuitry.

10. The row redundancy circuitry of claim 9 wherein the column determining line is a supplemental column address signal that is obtained from the column address bus, the supplemental column address signal being unique from the respective column address signals that are coupled to the first inputs of the first and the second switches.

11. The row redundancy circuitry of claim 8, further comprising a column address bus having a plurality of column address lines, and wherein the programming control circuitry further comprises:

a programming control line;

a first input that is coupled to the programming control line;

a second input coupled to a first column address line of said plurality of column address lines; and a group selection signal that is derived from a logical combination of signals obtained from the first and the second inputs of the programming control circuitry.

12. The row redundancy circuitry of claim 11 wherein the programming control circuitry further includes a first switch having a first input, a second input and an output, the first input being coupled to the group selection signal, the second input being coupled to a second column address line of said plurality of column address lines, and wherein the output of the first switch includes the first output of the programming control circuitry.

13. The row redundancy circuitry of claim 11 wherein the programming control circuitry further comprises a second switch having a first input, a second input and an output, the first input being coupled to the group selection signal, the second input being coupled to a second column address line of said plurality of column address lines, and wherein the output of the second switch includes the second output of the programming control circuitry.

14. A method for programming row redundancy registers in a row redundancy integrated circuitry for a semiconductor memory device having a defective memory element, comprising the steps of:

providing a column address to select one among a plurality of row redundancy registers;

providing the address of a first defective row of said memory element;

storing a first part of the address of the first defective row in a first set of programmable memory cells;

storing a second part of the address of the first defective row in a second set of programmable memory cells;

providing a second part of an address of a second defective row;

storing the second part of the address of the second defective row; and combining the first part of the full address of the first defective row with the second part of the address of the second defective row to provide a full address of the second defective row.

15. Row redundancy circuitry for use in a semiconductor memory device, the row redundancy circuitry comprising:

a first row address bus having a first plurality of row address lines;

a first group of programmable non-volatile memory cells, each non-volatile memory cell having a first input and a second input, the first input being coupled to a respective row address line from among the first plurality of row address lines that include the first row address bus;

a second row address bus having a second plurality of row address lines;

a second group of programmable non-volatile memory cells, each non-volatile memory cell having a first input and a second input, the first input being coupled to a respective row address line from among the second plurality of row address lines that include the second row address bus;

a third group of programmable non-volatile memory cells, each non-volatile memory cell having a first input and a second input, the first input being coupled to a respective row address line from among the second plurality of row address lines that comprise the second row address bus; and a programming control circuitry having a first output and a second output, the first output being coupled to the second input of each non-volatile memory cell of the first and the second groups of programmable non-volatile memory cells, and the second output being coupled to the second input of each non-volatile memory cell of the third group of programmable non-volatile memory cells.

* * * * *